United States Patent [19]
Ooms et al.

[11] 4,325,031
[45] Apr. 13, 1982

[54] DIVIDER WITH DUAL MODULUS PRESCALER FOR PHASE LOCKED LOOP FREQUENCY SYNTHESIZER

[75] Inventors: William J. Ooms, Hazelcrest; Richard E. Barnett, Palatine, both of Ill.

[73] Assignee: Motorola, Inc., Schaumburg, Ill.

[21] Appl. No.: 121,207

[22] Filed: Feb. 13, 1980

[51] Int. Cl.³ .................. H03K 21/36; H03L 7/18
[52] U.S. Cl. ..................... 331/1 A; 328/14; 328/42; 328/46; 328/48; 331/16; 331/25
[58] Field of Search .............. 331/1 A, 16, 18, 25; 328/14, 39, 41, 42, 46, 48, 155; 235/92 CC

[56] References Cited

U.S. PATENT DOCUMENTS

| | | | |
|---|---|---|---|
| 3,805,192 | 4/1974 | Ocnaschek et al. | 331/25 X |
| 3,811,092 | 5/1974 | Charbonnier | 328/39 |
| 3,849,635 | 11/1974 | Freedman | 235/92 CC |
| 3,959,737 | 5/1976 | Tanis | 331/1 A |
| 3,976,946 | 8/1976 | Schröder | 328/39 |
| 4,033,633 | 7/1977 | Miller et al. | 303/97 |
| 4,053,739 | 10/1977 | Miller et al. | 328/39 X |
| 4,121,162 | 10/1978 | Alberkrack et al. | 331/1 A X |
| 4,184,068 | 1/1980 | Washburn | 328/48 X |

Primary Examiner—Siegfried H. Grimm
Attorney, Agent, or Firm—James A. Scheer; James W. Gillman

[57] ABSTRACT

A high frequency divider suitable for use in a frequency synthesizer using a dual modulus prescaler and two counters to achieve high speed and low current drain. The input signal is alternately divided by one of the two moduli in the prescaler and then alternately divided by one of the two counters. Each of the two counters is reset while the other is counting thereby reducing circuit complexity and increasing circuit speed.

8 Claims, 3 Drawing Figures

DIVIDER WITH DUAL MODULUS PRESCALER FOR PHASE LOCKED LOOP FREQUENCY SYNTHESIZER

BACKGROUND OF THE INVENTION

A. Field of the Invention

The present invention pertains to the electronic signal processing art and in particular to a programmable frequency divider suitable for use in a frequency synthesizer.

B. Description of the Prior Art

Programmable frequency dividers are known in the electronic processing art, particularly in the frequency synthesizer field. Frequency synthesizers commonly employ standard phase locked loop circuitry wherein a controlled oscillator signal is divided by a loop divider. The output of the loop divider is fed back and compared in a phase comparator to a reference frequency signal. The phase comparator generates a control signal which is then coupled to the controlled oscillator, thereby providing an output signal from the controlled oscillator which has the desired frequency.

Previous techniques employed in digital frequency synthesizers have used a single programmable divider as the loop divider. This approach, however, has very serious problems in synthesizers used at very high frequencies. A suitable divider for a high frequency synthesizer would require a large divider using high speed logic which would make it difficult to interface with the rest of the synthesizer, and would be very expensive to integrate due to the large chip size required. A more serious disadvantage is the fact that such a loop divider would draw a very large current making it unsuitable for mobile or portable applications.

One approach to the solution of these problems is the use of a high speed prescaler of limited size followed by a lower speed programmable counter. This permits use of lower speed logic for most of the loop divider reducing cost and current drain. However, a major disadvantage is that the loop divider using a fixed prescaler can be reprogrammed only in increments equal to multiples of the prescaler modulus.

To deal with this problem another technique has been developed using a high speed dual modulus prescaler of limited size, and two programmable counters. The first counter is programmed to divide the output of the dual modulus prescaler by a number $N_p$. The second counter, often referred to as a "swallow counter," is programmed to divide the output of the dual modulus prescaler by a number A, which is less than $N_p$. The output of the controlled oscillator is divided by the prescaler, with first modulus P+1 and applied to both counters. When the count in the two counters reaches the number A, the swallow counter actuates the dual modulus prescaler to a new modulus P. The output of the prescaler then continues to be divided by the first counter. At the end of the count $N_P$ the counters must be reset. The total divisor of the loop divider $N_T$ is given by the formula:

$$N_T=(P+1)A+P(N_p-A)=PN_p+A$$

as discussed at page 1003 of the Motorola McMoss Handbook, printed 1974 by Motorola, Inc. From the above equation it can be seen that the dual modulus prescaler approach permits a change in the divide ratio in increments of one merely by reprogramming the value of A.

This dual modulus prescaler approach is limited in frequency by the fact that the counters must be reset at the end of the count. This problem can be partially compensated for by the use of complicated logic circuitry such as the Motorola type MC12014 control logic circuit presently available in the marketplace. This approach is rather costly and requires substantial current drain because of the large number of components and complexity of the control logic. Furthermore, it is difficult to integrate an entire loop divider of this type on a single chip. Thus, it is desireable to provide a divider circuit which can be used in a high frequency synthesizer which uses fewer parts, draws less current and is consequently less expensive to manufacture and yet adaptable for integration on a single chip.

SUMMARY OF THE INVENTION

It is an object of this invention to provide an improved high speed divider which is particularly suited for application in frequency synthesizers.

It is another object of the invention to provide a high speed programmable counter which does not require the use of complicated control circuitry.

It is another object of the invention to provide a high speed programmable divider which minimizes the current drain.

It is a further object of the invention to provide a high speed programmable divider which reduces the required number of component elements resulting in a reduction of costs and improved integratability.

Briefly, in accordance with one embodiment of the invention, a dual modulus prescaler divides the signal having a frequency f by one of two predetermined divisors, P and P'. The output of the prescaler is then applied through control logic to one of two counters with moduli A and B, respectively. The control logic controls both the A and B counters and the prescaler so that when the prescaler is dividing by P', the signal is applied to the A counter. When the A count is finished, the control logic will actuate the prescaler to modulus P and apply the signal to the B counter. While the B count is occurring, the A counter will be reset and while the A count is occurring the B count will be reset. This results in a divide ratio given by $N_T=A(P+1)+B(P)=P(B+A)+A$. Thus the divide ratio can be changed in increments of one by reprogramming the value of A and B.

It can be seen that the invention as described eliminates the need to reset the counters after a complete division cycle and therefore eliminates the need for the complicated look ahead logic required in the prior art. In addition, the fact that the two counters with modulus A and B can be made of approximately equal size, and the elimination of complex control logic reduces the chip size required and makes the divider more easily integratable on a single chip. The overall result is a programmable divider suitable for a high frequency synthesizer with simplified control circuitry so that manufacturing costs are reduced and current drain is reduced sufficiently to make it suitable for mobile and portable applications.

BRIEF DESCRIPTION OF THE DRAWINGS

Other objects, features and advantages of this invention will become apparent in the following description of the preferred embodiment in conjunction with the accompanying drawings.

FIG. 3 is a timing diagram showing wave forms at various points in the novel divider shown in FIG. 1.

DESCRIPTION OF THE PREFERRED EMBODIMENT OF THE INVENTION

Figure 1:
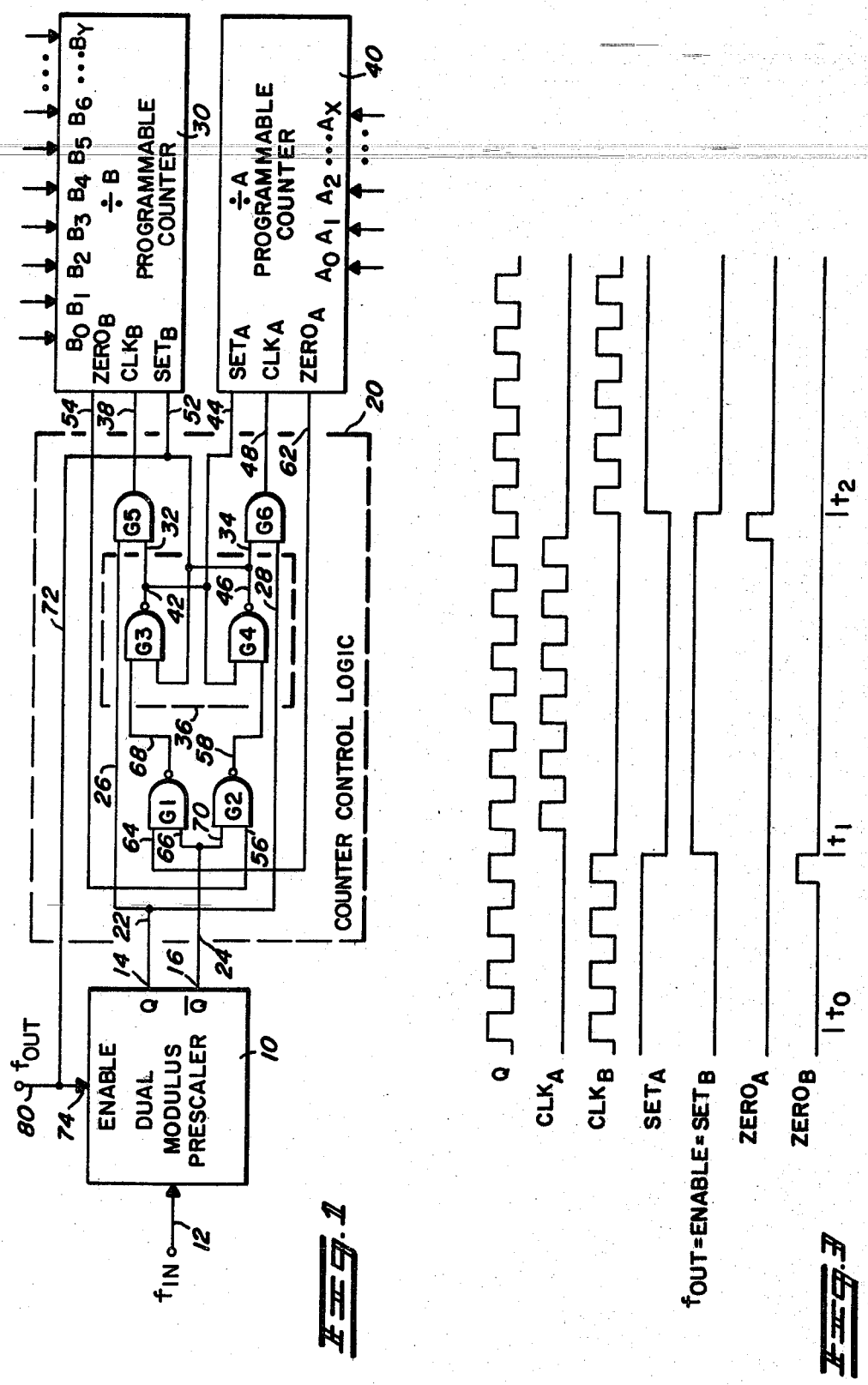
FIG. 1 is a schematic diagram illustrating the inventive high speed counter.

Referring to FIG. 1, a signal of frequency $f_{in}$ which is to be divided, is applied at the input 12 of a dual modulus prescaler 10 with moduli P and P'. An example of a commercially available prescaler which would be suitable is the Motorola MC12012. The dual modulus prescaler 10, operating in a well known manner, produces a divided signal at its Q output 14 and its $\overline{Q}$ output 16. The Q output 14 is coupled to the input 22 of the counter control logic 20 and the $\overline{Q}$ output 16 is coupled to the input 24 of the control logic 20. The control logic 20 is composed of conventional AND gates and NAND gates. A counter 30, to divide by the number B, and a counter 40, to divide by the number A, are also coupled to the control logic 20, in the manner indicated. The B counter 30 and the A counter 40 are preferably programmable down counters (programmed via inputs $B_o-B_y$ and $A_o-A_x$, respectively). (An example of a counter suitable for use in the present invention is a Motorola type MC74416). These counters are coupled to the control logic in such a manner as to produce an output frequency $f_{out}=F_{in}/N_T$ where $N_T$ is the overall divide ratio.

For a description of the operation of the circuit of FIG. 1, reference will be made to the timing diagram of FIG. 3. The input frequency $F_{in}$ applied to input 12 will be divided by the prescaler by a modulus P or P', where P' is equal to P+1 in the preferred embodiment. The modulus will be determined by a signal applied to the enable input 74 of the prescaler 10. The divided signal on the Q output 14 is a signal such as that shown as wave form Q of FIG. 3. This signal is coupled to input 22 and directly to the input 26 of AND gate G5 and to the input 28 of AND gate G6. The second input 32 to gate G5 and the second input 34 to gate G6 are controlled by the flip-flop composed of NAND gates G3 and G4, indicated generally at 36.

Thus, when the flip-flop at 36 is in a state as indicated by the conditions at $t_0$ of FIG. 3, the output of G3 will be high thus enabling gate G5, and the output 46 of gate G4 will be low thus disabling gate G6. As a result, the signal Q applied to input 26 of AND gate G5 will be gated through gate G5 to the $CLK_B$ input 38 of the B counter 30. In addition, the output 42 of gate G3 is coupled to the $SET_A$ input 44 of the A counter 40. Since the output 42 of gate G3 was high, the $SET_A$ input 44 will be high, which will cause the A counter to reset.

The low on the output 46 of gate G4 which is applied to the input 34 of gate G6 disables gate G6, thus preventing the clock signal Q from being applied to the $CLK_A$ input 48 of the A counter 40. This low on output 46 is also applied to the $SET_B$ input 52 of the B counter, which allows the B counter 30 to be decremented by the Q signal on the $CLK_B$ input 38.

When the value of the B counter 30 has been decremented all the way to zero, a high is generated on the $ZERO_B$ output 54. This signal is coupled directly to the input 56 of the NAND gate G2. In addition the Q signal from output 16 of the dual modulus prescaler 10 is coupled to the control logic input 24 and directed to the second input 70 of the gate G2. The resulting signal from the gate G2 is coupled to the input 58 of the gate G4, which causes the flip-flop 36 composed of gates the G3 and G4 to change to its opposite state. This is illustrated as occurring at time $t_1$ in the timing diagram of FIG. 3.

The new state of the flip-flop 36 results in the output 42 of the gate G3 going low and the output 46 of G4 going high. Therefore, the input 32 of the gate G5 will be low thus disabling the gate G5 and the input 34 of the gate G6 will be high thus enabling the gate G6. The result of this is that the Q signal is now gated through the gate G6 and applied to the $CLK_A$ input 48 of the A counter, and the Q signal is blocked by the gate G5 so that no signal is applied to the $CLK_B$ input of the B counter 30. In addition, the high on the output 46 of the gate G4 is applied to the $SET_B$ input 52 of the B counter 30. This causes the B counter to be reset. The low on output 42 of the gate G3 is also applied to the $SET_A$ input 44 of the A counter 40 which allows the A counter 40 to be decremented by the Q signal on the $CLK_A$ input 48. This results in the B counter 30 being set while the A counter 40 is decrementing.

When the A counter 40 has decremented all the way to zero, a high signal is generated on its $ZERO_A$ output 62 which is applied to the input 64 of the gate G1. This signal together with the $\overline{Q}$ signal applied to the input 66 of the gate G1, from control logic input 24, results in a signal applied to the input 68 of gate G3 of flip-flop 36 causing the flip-flop 36 to change to its opposite state. As a result of the change in state, the B counter 30 will begin to decrement and the A counter 40 will be reset in the same manner as described above. This event is illustrated at point $t_2$ in FIG. 3.

The signal which occurs on the $SET_B$ input 52 of the B counter 30 is also coupled via the feedback line 72 to the enable input 74 of the dual modulus prescaler 10. Whenever a transition occurs at the enable input 74, the modulus of the prescaler will be changed. In the preferred embodiment of the divider, the prescaler 10 will have a modulus of P during the B count and a modulus of P+1 during the A count.

The signal on the feedback line 72 is also coupled to the output 80. Thus, the output 46 of the gate G4, which is equivalent to the $SET_B$ waveform of FIG. 3, is coupled to the output 80. The output signal $f_{out}$ will therefore be identical to the waveform labelled $SET_B$ in FIG. 3. However, attention is drawn to the fact that the output could be taken from several other points as well while still attaining the same frequency $f_{out}$ (e.g. $SET_A$, $ZERO_A$, $ZERO_B$). This output frequency will be equal to the input frequency divided by the overall divide ratio $N_T$ where $N_T$ will be given by the following formula:

$$N_T = P(B) + A(P+1) = P(A+B) + A.$$

As can be seen from the formula, the divide ratio of the divider can be incremented by one by the process of reprogramming the value of B to be reduced by one, and reprogramming the value of A to be increased by one, resulting in a net increase in the divide ratio $N_T$ of one. The fact that the present divider can be easily programmed in increments of one even though it uses a prescaler renders the divider extremely useful in frequency synthesizer applications.

Figure 2:
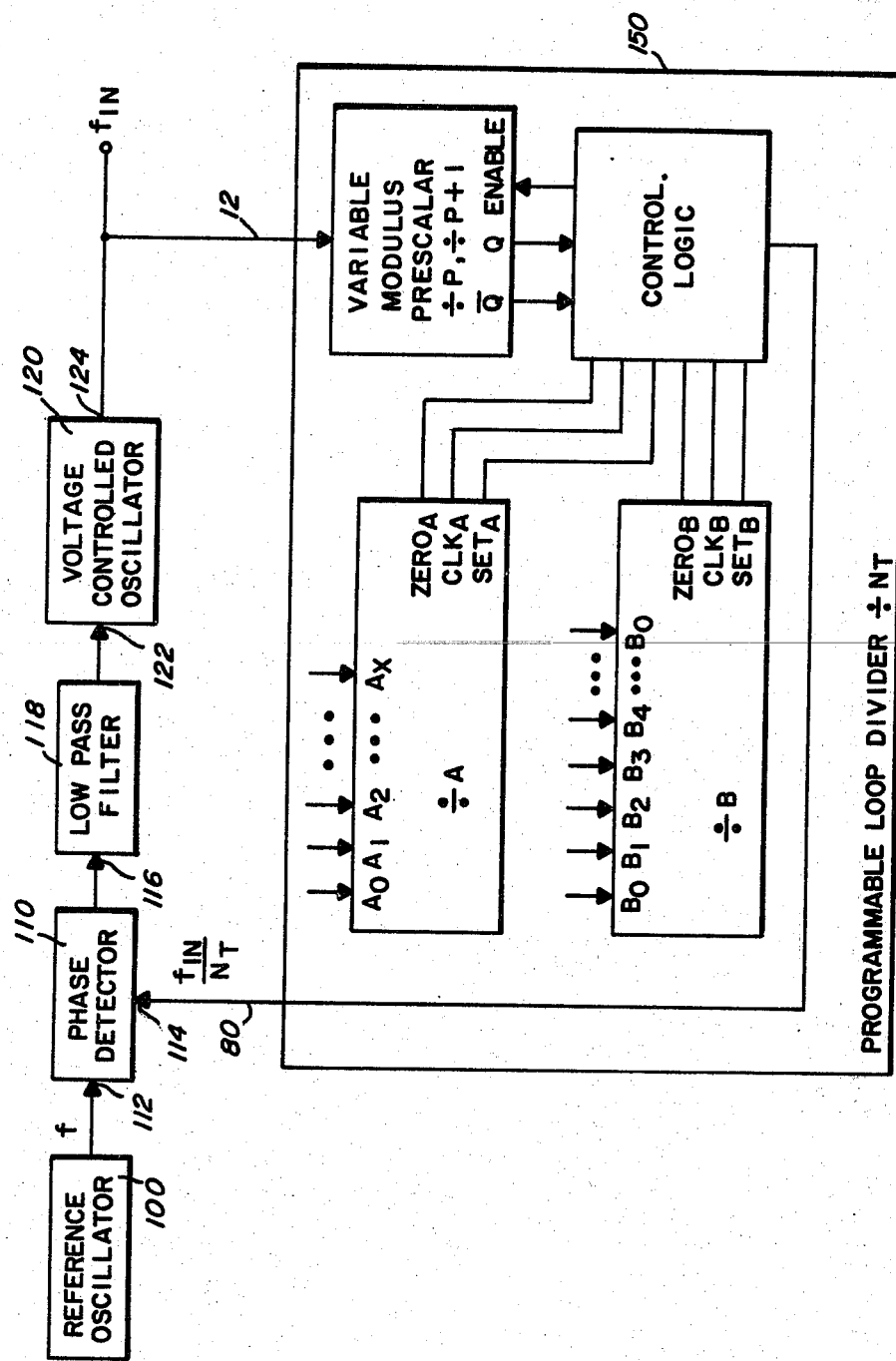
FIG. 2 is a block diagram illustrating a frequency synthesizer which employs the inventive divider as its loop divider.

FIG. 2 illustrates the preferred embodiment of an improved frequency synthesizer which employs the novel programmable divider. A standard phase locked loop is utilized including a reference oscillator 100 which produces a reference signal of a frequency f. The signal of frequency f is fed to the first input 112 of a phase detector 110 (for example, a Motorola MC4044). The phase detector 110 has a second input 114 and an output 116. Acting in the conventional manner, the phase detector 110 produces an error signal at its output 116, which error signal is representative of the phase difference between the signals received at the input terminals 112 and 114.

In the conventional manner, the output error signal at the output terminal 116 of the phase detector 110 is low pass filtered through a low pass filter circuit 118 and applied to the control input 122 of a voltage controlled oscillator 120 (for example, a Motorola MC1648). The voltage controlled oscillator 120 produces an oscillator signal of predetermined frequency at its output 124 responsive to a control signal received at the control input 122. This oscillator output signal is the signal shown as $f_{in}$ in FIG. 1.

The output terminal 124 of the voltage controlled oscillator 120 feeds to the input terminal 12 of the novel programmable divider 150. This is the programmable divider of FIG. 1. The programmable divider 150 responds to the signal $f_{in}$ at its divisor input 12 to divide the signal received at the input 12 by the number $N_T$ described above. In order to change the frequency at the output terminal 124, the divide ratio $N_T$ must be changed to a new value. The frequency of the signal at the output terminal 124 will be equal to the reference oscillator frequency f times the divide ratio $N_T$ (i.e. $f_{in} = f \times N_T$). Thus, in order to have the capability of generating frequencies with increments of f, the programmable loop divider 150 must have a divide ratio $N_T$ which is programmable in increments of one. It can be seen that the novel programmable divider of FIG. 1 is highly suited for such frequency synthesis applications.

Thus, an improved programmable divider is provided which is particularly suited for use in frequency synthesizer applications. The divider not only has the greater speed resulting from the use of dual modulus prescaler and the alternate resetting of the A and B counters, but also has simplified control logic which enhances integratability and reduces power consumption.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed and claimed herein.

We claim:

1. A high speed frequency divider, suitable for use in a phase locked loop, comprising:
   dual modulus prescaler means, having an input and an output, for frequency dividing an input signal by one of two predetermined divisors P and P', and applying the divided signal to the output;
   first means for frequency dividing the signal at the output of the prescaler means by the divisor A;
   second means for frequency dividing the signal at the output of the prescaler means by the divisor B;
   logic means for controlling the prescaler means and dividing means so that the signal at the output of the prescaler means is alternately frequency divided by A and B, and such that the first dividing means is reset while the division by B is occurring and the second dividing means is reset while the division by A is occurring; said logic means including means for actuating the prescaler means from its P' divisor to its P divisor upon transition from the A divisor to the B divisor and from its P divisor to its P' divisor upon transition from the B divisor to the A divisor, and including means for coupling to an output a divided signal having a transition for each actuation of the prescaler;
   whereby the overall divide ratio $N_T$ is given by $N_T = PB + P'A$.

2. The high speed divider of claim 1 wherein P' is equal to P+1.

3. The high speed divider of claim 1 or 2 wherein the first and second means for frequency dividing are programmable counters.

4. An improved, high speed, low current drain frequency synthesizer, comprising:
   a reference signal source for generating a reference signal of frequency f;
   a phase comparator, having a first input coupled to the signal source, a second input and an output, for producing at the output an error signal representative of the phase difference of signals received at the first and the second input;
   a signal controlled oscillator for producing an oscillator signal of predetermined frequency at its output responsive to a received control signal;
   means for processing the phase comparator error signal to produce a control signal and for applying the control signal to the controlled oscillator;
   programmable divider means for frequency dividing the controlled oscillator signal by a divisor $N_T$ and applying the divided signal to the second input of the phase comparator, including prescaler means to frequency divide the oscillator signal by one of two predetermined moduli P and P', means for frequency dividing the prescaler divided signal by the divisor A, means for frequency dividing the prescaler divided signal by divisor B, logic means for controlling the prescaling means and dividing means so that the prescaler divided signals are alternately frequency divided by A and B, and the first dividing means is preset while the division by B is occurring and the second dividing means is preset while the division by A is occurring, said logic means including means for actuating the prescaling means from its P' divisor to its P divisor upon transition from the A divisor to the B divisor and from its P divisor to its P' divisor upon transition from the B divisor to the A divisor, and including means for coupling to an output a divided signal having a transition for each actuation of the prescaler, whereby the overall divisor $N_T = P(B) + P'(A)$.

5. The frequency synthesizer of claim 4 wherein P' is equal to P+1.

6. The frequency synthesizer of claim 4 or 5 wherein the means for frequency dividing by the modulus A, and the means for frequency dividing by the modulus B are both programmable counters.

7. A method for dividing an oscillator signal by a value $N_T = PB + P'A$ utilizing a dual modulus prescaler of predetermined moduli P and P', a counter of modulus A and a counter of modulus B, comprising the steps of:

(a) frequency dividing the oscillator signal in the prescaler by the divisor P';

(b) counting the P' divided signal in the counter of modulus A;

(c) resetting the counter of modulus B during the A count;

(d) dividing the oscillator signal in the prescaler by the divisor P after completion of the A count;

(e) counting the P divided signal in the counter of modulus B;

(f) resetting the A counter during the B count;

(g) outputting a signal from one of the counters having a frequency equal to the oscillator signal divided by $N_T$;

(h) repeating steps (a) through (g).

8. The method of claim 7 wherein $P' = P + 1$.

* * * * *